US010210942B2

(12) United States Patent
Kim

(10) Patent No.: US 10,210,942 B2
(45) Date of Patent: Feb. 19, 2019

(54) SEMICONDUCTOR MEMORY DEVICE AND METHOD OF OPERATING THE SAME

(71) Applicant: SK hynix Inc., Gyeonggi-do (KR)

(72) Inventor: Se Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/895,461

(22) Filed: Feb. 13, 2018

(65) Prior Publication Data

US 2019/0019562 A1 Jan. 17, 2019

(30) Foreign Application Priority Data

Jul. 14, 2017 (KR) .................. 10-2017-0089599

(51) Int. Cl.
| | |
|---|---|
| *G11C 16/34* | (2006.01) |
| *G11C 16/30* | (2006.01) |
| *G11C 16/10* | (2006.01) |
| *G11C 16/08* | (2006.01) |
| *G11C 16/04* | (2006.01) |

(52) U.S. Cl.
CPC .......... *G11C 16/3459* (2013.01); *G11C 16/08* (2013.01); *G11C 16/10* (2013.01); *G11C 16/30* (2013.01); *G11C 16/0483* (2013.01); *G11C 2216/16* (2013.01)

(58) Field of Classification Search
CPC ..... G11C 16/0483; G11C 16/08; G11C 16/10; G11C 16/30; G11C 16/34; G11C 16/3459; G11C 2216/16

USPC ............ 365/185.13, 185.02, 185.11, 185.18, 365/185.22, 185.23, 226, 230.03, 230.06
See application file for complete search history.

(56) References Cited

U.S. PATENT DOCUMENTS

| | | | | |
|---|---|---|---|---|
| 2010/0302865 A1* | 12/2010 | Wang | ................ | G11C 11/5628 365/185.22 |
| 2012/0268993 A1* | 10/2012 | Park | ................ | G11C 16/10 365/185.11 |
| 2016/0125946 A1* | 5/2016 | Jeon | ................ | G11C 16/14 365/185.11 |
| 2016/0217863 A1* | 7/2016 | An | ................ | G11C 16/14 |

FOREIGN PATENT DOCUMENTS

| | | |
|---|---|---|
| KR | 1020150130637 | 11/2015 |
| KR | 1020160059174 | 5/2016 |

* cited by examiner

*Primary Examiner* — Tan T. Nguyen
(74) *Attorney, Agent, or Firm* — IP & T Group LLP

(57) ABSTRACT

Provided is a semiconductor memory device and a method of operating the same. The semiconductor memory device may include a memory unit including a plurality of memory blocks; a voltage supply circuit configured to generate a plurality of operating voltages and output the generated operating voltages to at least two global line groups during a program operation on the memory unit; a pass circuit configured to couple word lines of the memory blocks to the at least two global line groups; and a control logic configured to control the voltage supply circuit and the pass circuit such that during a program verify operation of the program operation, a program verify voltage is applied to a selected memory block of the memory blocks, and a set voltage is applied to a share memory block sharing with the selected memory block among unselected memory blocks.

25 Claims, 11 Drawing Sheets

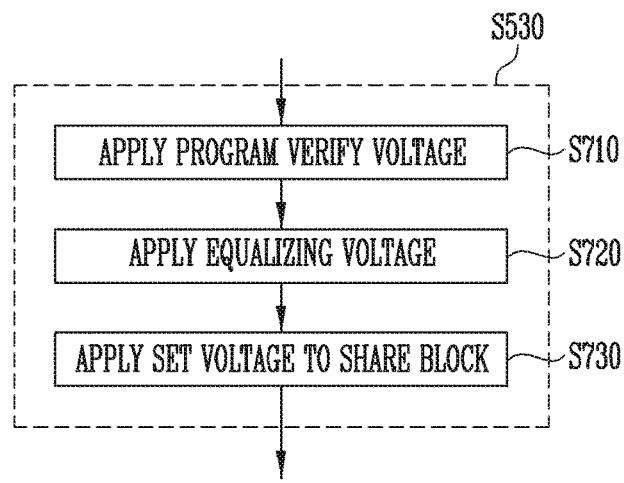
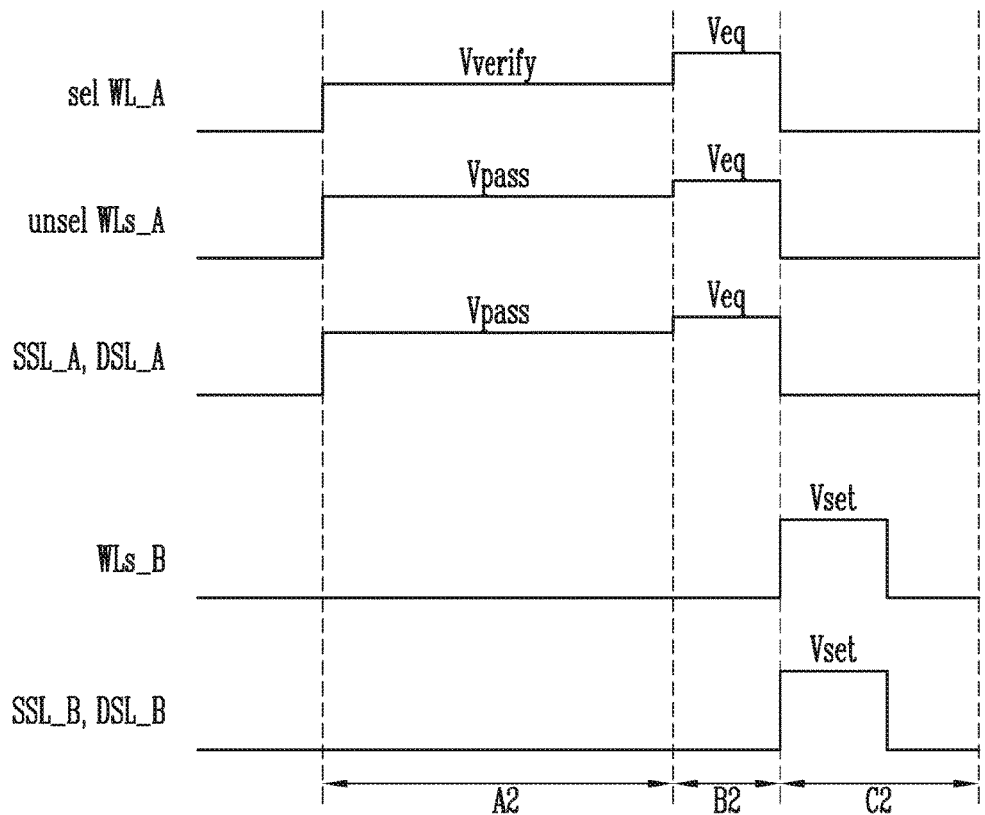

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2017-0089599 filed on Jul. 14, 2017, which is incorporated herein by reference in its entirety.

BACKGROUND

1. Field of Invention

Various embodiments of the present disclosure relate to an electronic device. Particularly, exemplary embodiments of the present disclosure relate to a semiconductor memory device and a method of operating the same.

2. Description of Related Art

Semiconductors are widely used in electronic devices. Among many types of semiconductors, semiconductor memory devices may generally be classified into volatile memory and nonvolatile memory devices.

The nonvolatile memory devices have comparatively low write and read speed, but retain data stored therein even when power is turned off. Therefore, the nonvolatile memory devices are used when there is the need for storing data which must be retained regardless of the supply of power.

Among the nonvolatile memory devices, a flash memory device has both advantages of RAM in which data is programmable and erasable and advantages of ROM in which data stored therein can be retained even when power is interrupted.

Flash memory devices may be classified into a two-dimensional semiconductor memory device in which strings are horizontally formed on a semiconductor substrate, and a three-dimensional semiconductor memory device in which strings are vertically formed on the semiconductor substrate.

SUMMARY

Various embodiments of the present disclosure are directed to a semiconductor memory device which has improved electrical characteristics by effectively removing holes that remain in the channel of an unselected memory block that shares a block decoder with a selected memory block of the semiconductor memory device, and a method of operating the semiconductor memory device.

An embodiment of the present disclosure may provide for a semiconductor memory device including: a memory unit including a plurality of memory blocks; a voltage supply circuit configured to generate a plurality of operating voltages and output the generated operating voltages to at least two global line groups during a program operation on the memory unit; a pass circuit configured to couple word lines of the memory blocks to the at least two global line groups; and a control logic configured to control the voltage supply circuit and the pass circuit such that during a program verify operation of the program operation, a program verify voltage is applied to a selected memory block of the memory blocks, and a set voltage is applied to a share memory block sharing with the selected memory block among unselected memory blocks.

An embodiment of the present disclosure may provide for a semiconductor memory device including: a memory unit including a plurality of memory blocks; a block decoder circuit configured to generate a plurality of block select signals in response to a decoder control signal and an address signal; a pass circuit configured to couple first and second global word line groups to word lines of the memory blocks in response to the block select signals; a voltage supply circuit configured to generate operating voltages and a set voltage and output the operating voltages and the set voltage to the first and second global word line groups; and a control logic configured to control the voltage supply circuit and the block decoder circuit such that during a program verify operation, the operating voltages are applied to word lines of a selected memory block of the memory blocks and the set voltage is applied to word lines of a share memory block sharing with the selected memory block among unselected memory blocks.

An embodiment of the present disclosure may provide for a method of operating a semiconductor memory device, including: providing a memory unit including at least two memory blocks sharing a single block decoder with each other; applying a program voltage to a selected memory block included in the memory unit; performing a program verify operation on the selected memory block; and applying, during the program verify operation, a set voltage to a share memory block sharing with the selected memory block.

BRIEF DESCRIPTION OF THE DRAWINGS

FIGS. 7A and 7B are a flowchart and a signal waveform diagram illustrating a program verify operation of the semiconductor memory device according to a second embodiment of the present disclosure.

DETAILED DESCRIPTION

Figure 1:
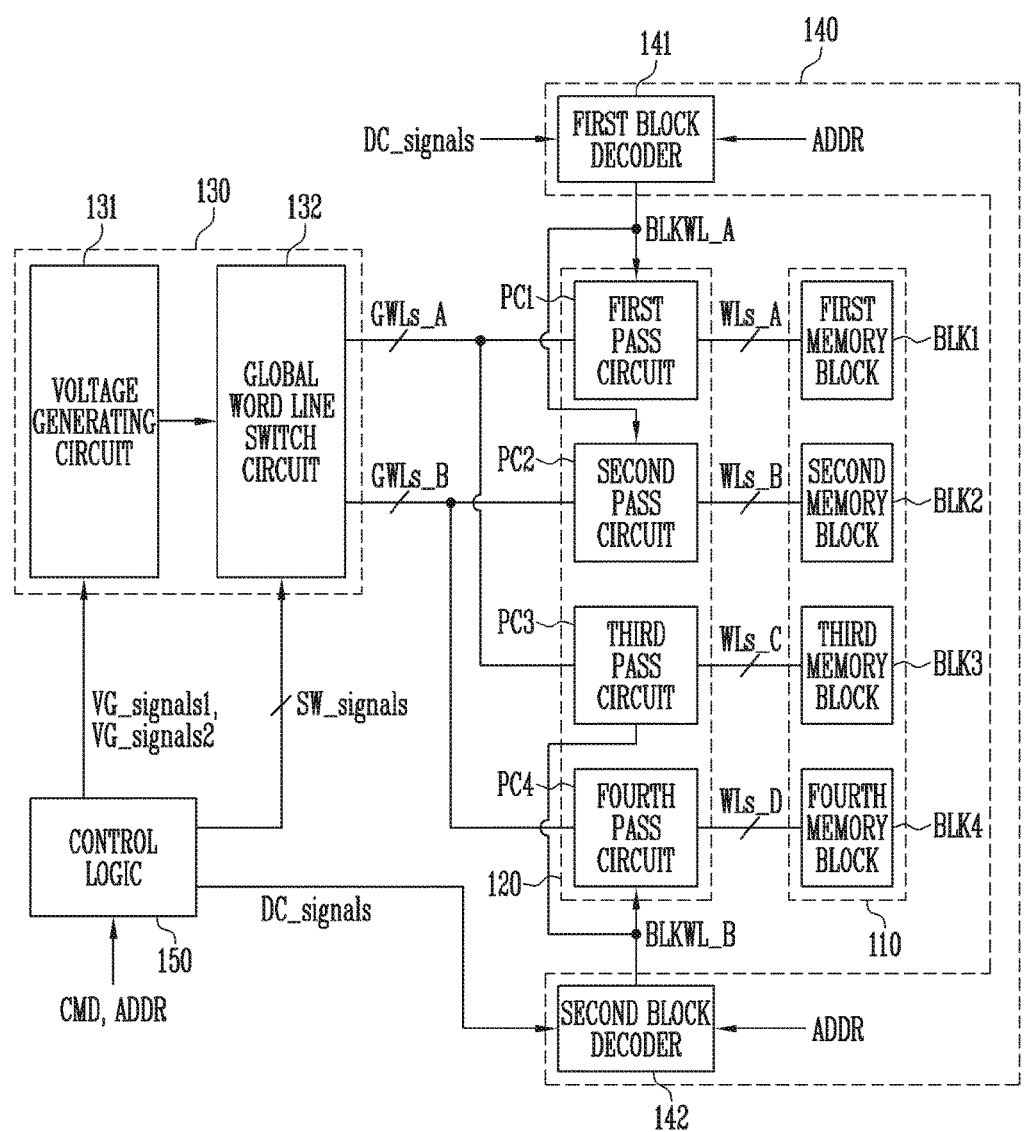
FIG. 1 is a block diagram illustrating a semiconductor memory device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a block diagram illustrating a semiconductor memory device 100 according to an embodiment of the present disclosure.

Referring to FIG. 1, the semiconductor memory device 100 may include a memory unit 110, a pass circuit 120, a voltage supply circuit 130, a block decoder circuit 140, and a control logic 150. The semiconductor memory device 100 may be any suitable type of analog and/or digital integrated circuits, and examples thereof include a processor, a micro-control unit, an electronic sensor, and a memory device such as, e.g., DRAM, Flash, and a resistive memory.

The memory unit 110 may include a plurality of memory blocks. Although FIG. 1 shows one exemplary embodiment where the memory unit 110 includes first to fourth memory blocks BLK1 to BLK4, the present disclosure is not limited to the particular example, and any suitable number of memory blocks may be used according to various embodiments.

Each of the first to fourth memory blocks BLK1 to BLK4 may include a plurality of memory cells. In an embodiment, the memory cells may be hardware elements designed to store data therein, and examples thereof include nonvolatile memory cells. Memory cells coupled to the same word line among the plurality of memory cells may be defined as one page. Each of the first to fourth memory blocks BLK1 to BLK4 may include a plurality of strings.

In an embodiment of the present disclosure, the first memory block BLK1 and the third memory block BLK3 may correspond to a first global word line group GWLs_A, and the second memory block BLK2 and the fourth memory block BLK4 may correspond to a second global word line group GWLs_B. Furthermore, the first memory block BLK1 and the second memory block BLK2 may share a first block decoder 141, and the third memory block BLK3 and the fourth memory block BLK4 may share a second block decoder 142.

An exemplary configuration of the first to fourth memory block BLK1 to BLK4 is described below.

The pass circuit 120 may include a plurality of pass circuits. In an embodiment, the pass circuit 120 may include pass circuits that correspond to the respective memory blocks included in the memory unit 110. Although FIG. 1 shows that the pass circuit 120 includes a first pass circuit PC1 corresponding to the first memory block BLK1, a second pass circuit PC2 corresponding to the second memory block BLK2, a third pass circuit PC3 corresponding to the third memory block BLK3, and a fourth pass circuit PC4 corresponding to the fourth memory block BLK4, exemplary embodiments of the present disclosure are not limited thereto, and any suitable number and combination of pass circuits/memory blocks may be employed.

In accordance with one embodiment, the first pass circuit PC1 may be coupled between the first global word line group GWLs_A and word lines WLs_A of the first memory block BLK1, so that the first pass circuit PC1 couples or isolates the first global word line group GWLs_A to or from the word lines WLs_A in response to a first block select signal BLKWL_A.

Similarly, the second pass circuit PC2 may be coupled between the second global word line group GWLs_B and word lines WLs_B of the second memory block BLK2, so that the second pass circuit PC2 couples or isolates the second global word line group GWLs_B to or from the word lines WLs_B in response to the first block select signal BLKWL_A.

Further, the third pass circuit PC3 may be coupled between the first global word line group GWLs_A and word lines WLs_C of the third memory block BLK3, so that the third pass circuit PC3 couples or isolates the first global word line group GWLs_A to or from the word lines WLs_C in response to a second block select signal BLKWL_B.

The fourth pass circuit PC4 may be coupled between the second global word line group GWLs_B and word lines WLs_D of the fourth memory block BLK4, so that the fourth pass circuit PC4 couples or isolates the second global word line group GWLs_B to or from the word lines WLs_D in response to the second block select signal BLKWL_B.

In each of the first to fourth pass circuits PC1 to PC4, during an operation of the semiconductor memory device 100 such as, e.g, a program operation or a read operation, if a memory block is a selected memory block, the corresponding pass circuit PC1, PC2, PC3, or PC4 applies operating voltages, which are received through the first global word line group GWLs_A or the second global word line group GWLs_B, to the word lines of the selected memory block.

Further, in each of the first to fourth pass circuits PC1 and PC4, during a program verify operation of the program operation, if the corresponding memory block is an unselected memory block and is a share memory block that shares a block decoder with the selected memory block, the corresponding pass circuit PC1, PC2, PC3, or PC4 applies a positive set voltage to the word lines of the corresponding share memory block through the first global word line group GWLs_A or the second global word line group GWLs_B, so that holes remaining in the channel of the share memory block can be effectively removed.

In accordance with one exemplary embodiment, the voltage supply circuit 130 may include a voltage generating circuit 131 and a global word line switch circuit 132.

The voltage generating circuit 131 generates a plurality of operating voltages to be used during the overall operation of the semiconductor memory device 100, in response to first and second voltage generation control signals VG_signals1 and VG_signals2.

For example, during a program verify operation of the semiconductor memory device 100, the voltage generating circuit 131 generates a verify voltage and a pass voltage to be applied to word lines of a selected memory block in response to the first control signals VG_signals1, and generates a positive set voltage to be applied to word lines of unselected memory blocks in response to the second control signals VG_signals2. According to one exemplary embodiment, the set voltage Vset for the share memory block may be any suitable voltage for removing holes remaining in the channel of the share memory block. The set voltage Vset may be independently determined from the operating voltages (e.g., the program, verify, and pass voltages) and may be a positive voltage.

The global word line switch circuit 132 switches the operating voltages and the positive set voltage generated from the voltage generating circuit 131 in response to switching control signals SW_signals, and transmits the operating voltages and the positive set voltage to the first global word line group GWLs_A and the second global word line group GWLs_B.

In accordance with one exemplary embodiment, the block decoder circuit 140 may include a plurality of block decoders. In an embodiment, the block decoder circuit 140 may be configured such that at least two memory blocks included in the memory unit 110 correspond to a single block decoder. Although FIG. 1 shows that the block decoder circuit 140 includes a first block decoder 141 corresponding to the first and second memory blocks BLK1 and BLK2, and a second block decoder 142 corresponding to the third and fourth memory blocks BLK3 and BLK4, exemplary embodiments of the present disclosure are not limited thereto, and any suitable number and combination of block decoders/memory blocks may be employed.

The block decoder circuit 140 generates a first block select signal BLKWL_A and a second block select signal BLKWL_B in response to address signals ADDR and decoder control signals DC_signals.

The first block decoder 141 generates the first block select signal BLKWL_A in response to an address signal ADDR and a decoder control signal DC_signals. For example, in the case where the first memory block BLK1 or the second memory block BLK2 is a selected memory block during the overall operation of the semiconductor memory device 100, the first block decoder 141 generates a first block select signal BLKWL_A which is enabled to a high logic level in response to an address signal ADDR corresponding to the first memory block BLK1 or the second memory block BLK2, and outputs the generated first block select signal BLKWL_A to the first pass circuit PC1 and the second pass circuit PC2. In the case where the third memory block BLK3 or the fourth memory block BLK4 is a selected memory block, the first block decoder 141 is maintained in a disabled state in response to an address signal ADDR corresponding to the third memory block BLK3 or the fourth memory block BLK4.

The second block decoder 142 generates the second block select signal BLKWL_B in response to an address signal ADDR and a decoder control signal DC_signals. For example, in the case where the third memory block BLK3 or the fourth memory block BLK4 is a selected memory block during the overall operation of the semiconductor memory device 100, the second block decoder 142 generates a second block select signal BLKWL_B which is enabled to a high logic level in response to an address signal ADDR corresponding to the third memory block BLK3 or the fourth memory block BLK4, and outputs the generated second block select signal BLKWL_B to the third pass circuit PC3 and the fourth pass circuit PC4. In the case where the first memory block BLK1 or the second memory block BLK2 is a selected memory block, the second block decoder 142 is maintained in a disabled state in response to an address signal ADDR corresponding to the first memory block BLK1 or the second memory block BLK2.

The control logic 150 may control the voltage supply circuit 130 and the block decoder circuit 140 in response to a command signal CMD and an address signal ADDR that are inputted from an external device. For example, if a command signal CMD pertaining to a program operation is inputted, the control logic 150 may generate and output first and second voltage generation control signals VG_signals1 and VG_signals2 such that the voltage generating circuit 131 of the voltage supply circuit 130 generates a plurality of operating voltages and a positive set voltage, and may also generate and output switching control signals SW_signals for controlling the global word line switch circuit 132 such that the global word line switch circuit 132 switches the plurality of operating voltages and the positive set voltage to the first global word line group GWLs_A and the second global word line group GWLs_B.

Furthermore, the control logic 150 may generate and output decoder control signals DC_signals to control the block decoder circuit 140.

Figure 2:
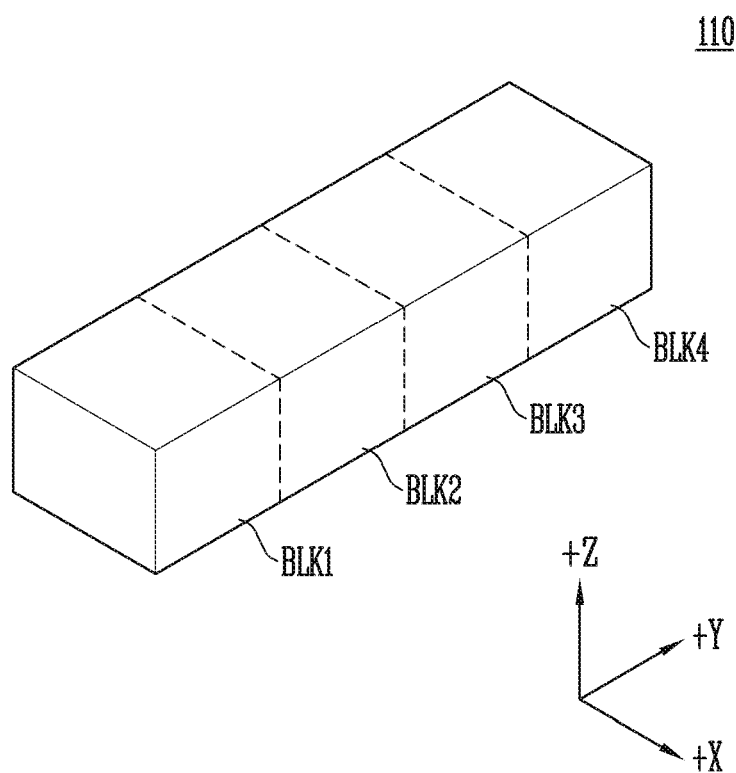
FIG. 2 is a block diagram illustrating an embodiment of a memory unit of FIG. 1.

FIG. 2 is a block diagram illustrating an embodiment of the memory unit 110 of FIG. 1.

Referring to FIG. 2, the memory unit 110 may include first to fourth memory blocks BLK1 to BLK4. Each of the memory blocks may have a two-dimensional (2D) or a three-dimensional (3D) structure. Each of the memory blocks may include the plurality of memory cells stacked on a substrate. When the memory blocks have a 3D structure, as shown in FIG. 2, the memory unit 110 may include first to fourth memory blocks BLK1 to BLK4 each having a 3D structure (or vertical structure). The plurality of memory cells is arranged in a +X-axis direction, a +Y-axis direction, and a +Z-axis direction. A structure of each of the memory blocks will be described in more detail with reference to FIG. 3.

Figure 3:
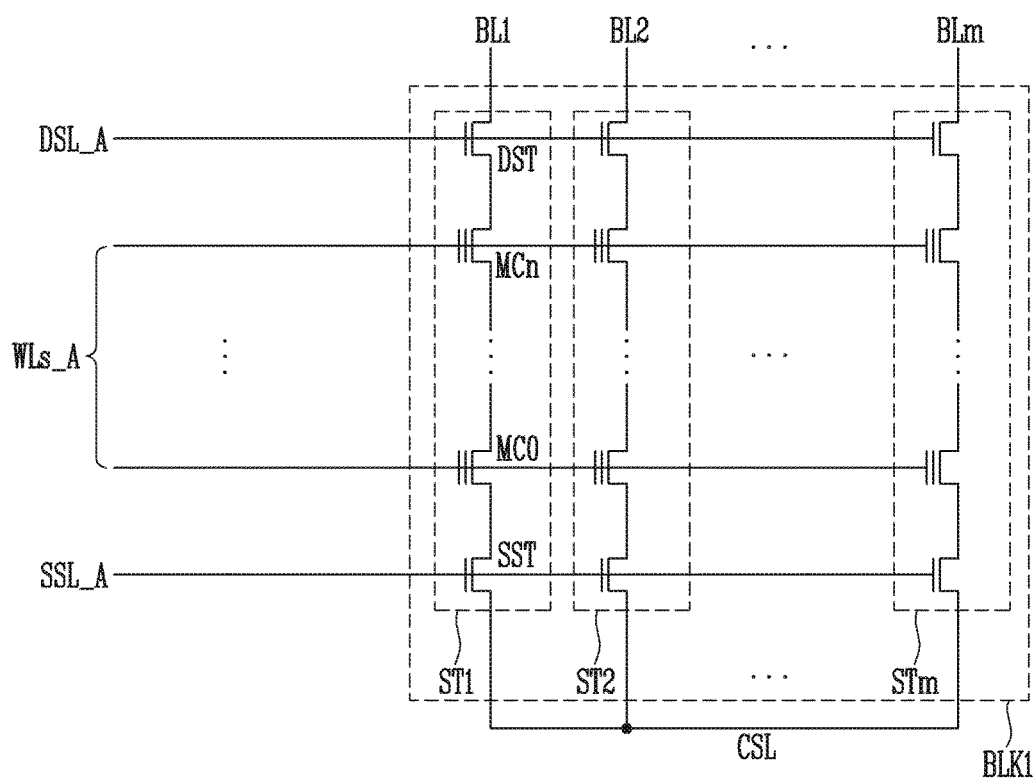
FIG. 3 is a circuit diagram illustrating a memory block of FIG. 1.

FIG. 3 is an exemplary circuit diagram of the first memory block BLK1 among the memory blocks included in the memory unit 110 of FIG. 1.

The first memory block BLK1 and the second to fourth memory blocks BLK2 to BLK4 of FIG. 1 may have the same structure; therefore, for ease of explanation, only the first memory block BLK1 will be described below.

The first memory block BLK1 includes a plurality of strings ST1 to STm which are respectively coupled between a common source line CSL and a plurality of bit lines BL1 to BLm.

The plurality of strings ST1 to STm may have the same structure. The first string ST1 includes a source select transistor SST, a plurality of memory cells MC0 to MCn, and a drain select transistor DST, all of which are coupled in series between the common source line CSL and the bit line BL1. The gates of the plurality of memory cells MC0 to MCn are coupled to the respective word lines WLs_A. The gate of the drain select transistor DST is coupled to a drain select line DSL_A. The gate of the source select transistor SST is coupled to a source select line SSL_A.

Figure 4:
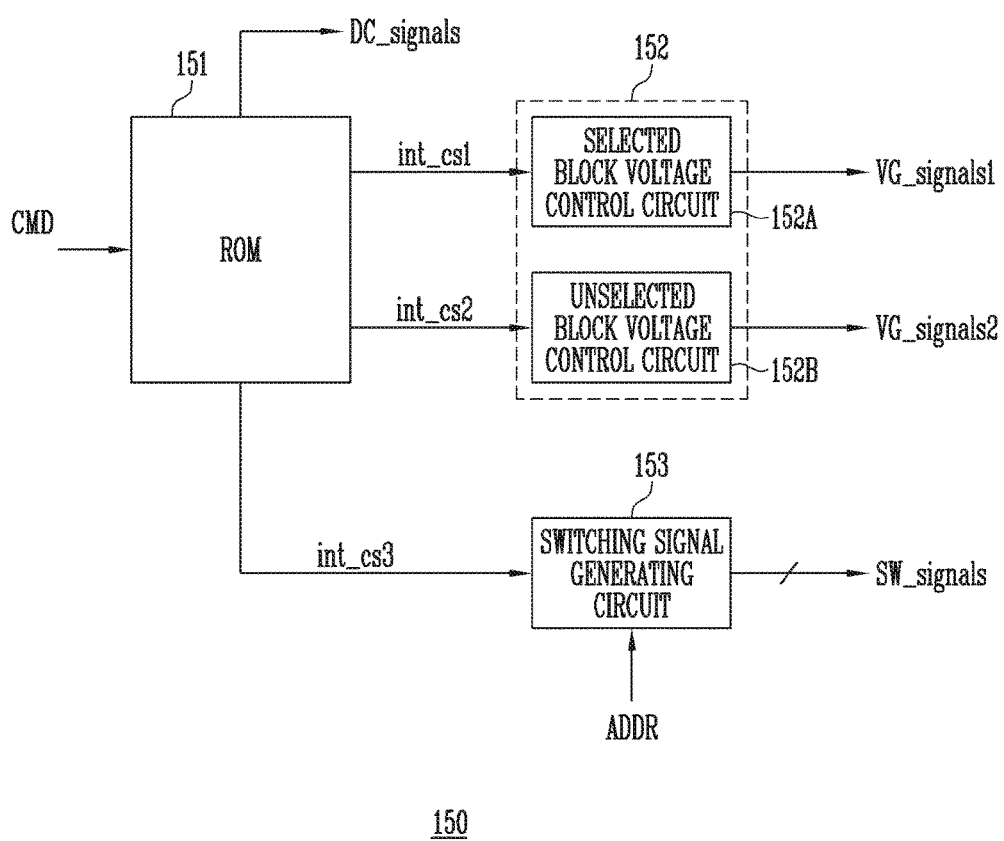
FIG. 4 is a block diagram illustrating an embodiment of a control logic of FIG. 1.

FIG. 4 is a block diagram illustrating an embodiment of the control logic 150 of FIG. 1.

Referring to FIG. 4, the control logic 150 may include a ROM 151, a voltage generation control circuit 152, and a switching signal generating circuit 153.

The ROM 151 may store an algorithm for performing overall operations of the semiconductor memory device, and may generate and output first to third internal control signals int_cs1 to int_cs3 and a decoder control signal DC_signals according to the algorithm stored therein in response to a command signal CMD inputted from a host coupled to the semiconductor memory device. The ROM 151 may include any suitable hardware circuit to perform the aforementioned functions.

The voltage generation control circuit 152 may include a selected block voltage control circuit 152A and an unselected block voltage control circuit 152B.

The selected block voltage control circuit 152A may generate and output, in response to a first internal control signal int_cs1, first voltage generation control signals VG_signals1 for controlling the voltage generating circuit 131 of FIG. 1 such that the voltage generating circuit 131 generates operating voltages to be applied to word lines of a selected memory block.

The unselected block voltage control circuit 152B may generate and output, in response to a second internal control signal int_cs2, second voltage generation control signals VG_signals2 for controlling the voltage generating circuit 131 of FIG. 1 such that the voltage generating circuit 131 generates a positive set voltage to be applied to word lines of an unselected memory block.

The switching signal generating circuit 153 generates and outputs, in response to an address signal ADDR and a third internal control signal int_cs3, switching control signals SW_signals for controlling the global word line switch circuit 132 of FIG. 1 such that the global word line switch circuit 132 switches the operating voltages for the selected memory block and the positive set voltage for the unselected memory block, which are generated from the voltage generating circuit 131, to the first global word line group GWLs_A and the second global word line group GWLs_B.

Figure 5:
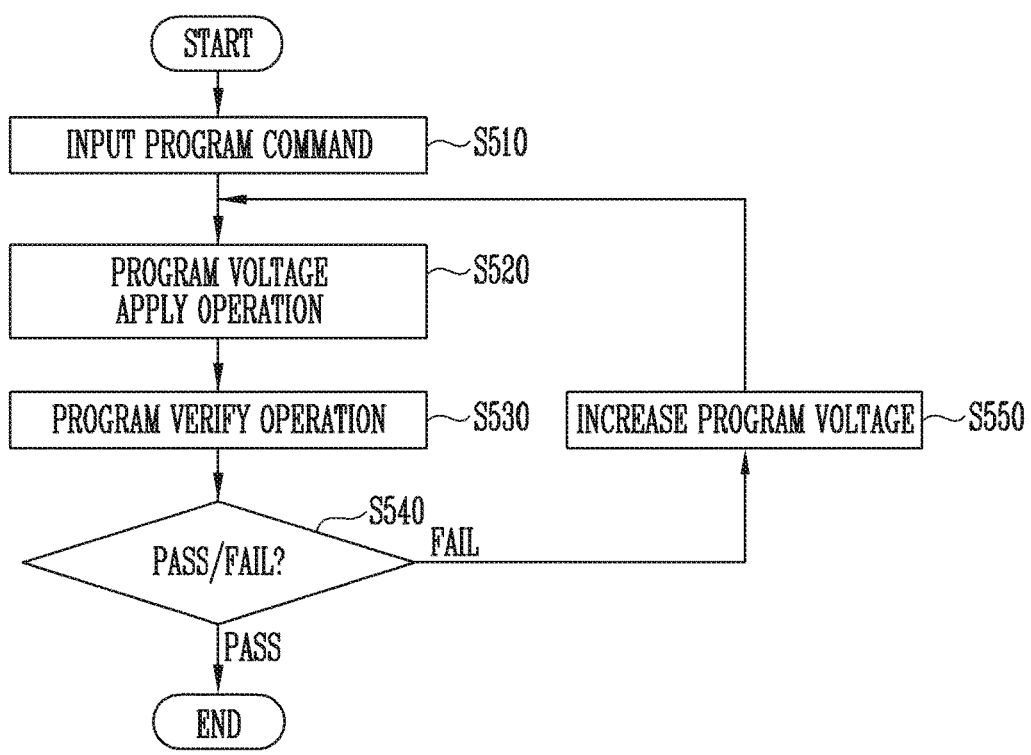
FIG. 5 is a flowchart illustrating a method of operating the semiconductor memory device according to an embodiment of the present disclosure.

FIG. 5 is a flowchart illustrating a method of operating the semiconductor memory device according to an embodiment of the present disclosure.

While describing a program operation of the semiconductor memory device 100 according to an embodiment of the present disclosure, references will be made to FIGS. 1 to 5.

For ease of description, it is assumed that the first memory block BLK1 is a selected memory block, and the second to fourth memory blocks BLK2 to BLK4 are unselected memory blocks according to one exemplary embodiment, although various embodiments of the present disclosure are not limited thereto. The second memory block BLK2 may be defined as a share memory block which shares the first block decoder 141 with the selected first memory block BLK1.

When a command signal CMD and an address signal ADDR corresponding to a program operation are inputted from the external device, at step S510, the voltage generating circuit 131 generates a program voltage and a pass voltage to be applied to the selected memory block in response to a first voltage generation control signal VG_signals1 outputted from the control logic 150. In addition, the voltage generating circuit 131 generates a pass voltage to be applied to the unselected memory blocks in response to a second voltage generation control signal VG_signals2 outputted from the control logic 150.

The global word line switch circuit 132 switches and transmits the program voltage and the pass voltage to the first global word line group GWLs_A in response to switching control signals SW_signals, and switches and transmits the pass voltage to the second global word line group GWLs_B.

The first block decoder 141 enables a first block select signal BLKWL_A to a high logic level and outputs it, in response to an address signal ADDR and decoder control signals DC_signals.

At step S520, the first pass circuit PC1 applies the program voltage to a selected word line of the selected first memory block BLK1 in response to the first block select signal BLKWL_A, and applies the pass voltage to the other unselected word lines. The second pass circuit PC2 applies the pass voltage to the word lines WLs_B of the second memory block BLK2 in response to the first block select signal BLKWL_A.

Thereafter, at step S530, a program verify operation is performed.

Figure 6A:
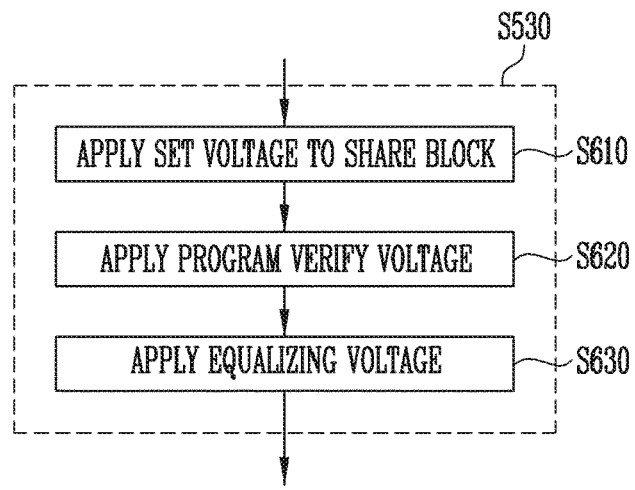
FIGS. 6A and 6B are a flowchart and a signal waveform diagram illustrating a program verify operation of the semiconductor memory device according to a first embodiment of the present disclosure.
Figure 6B:
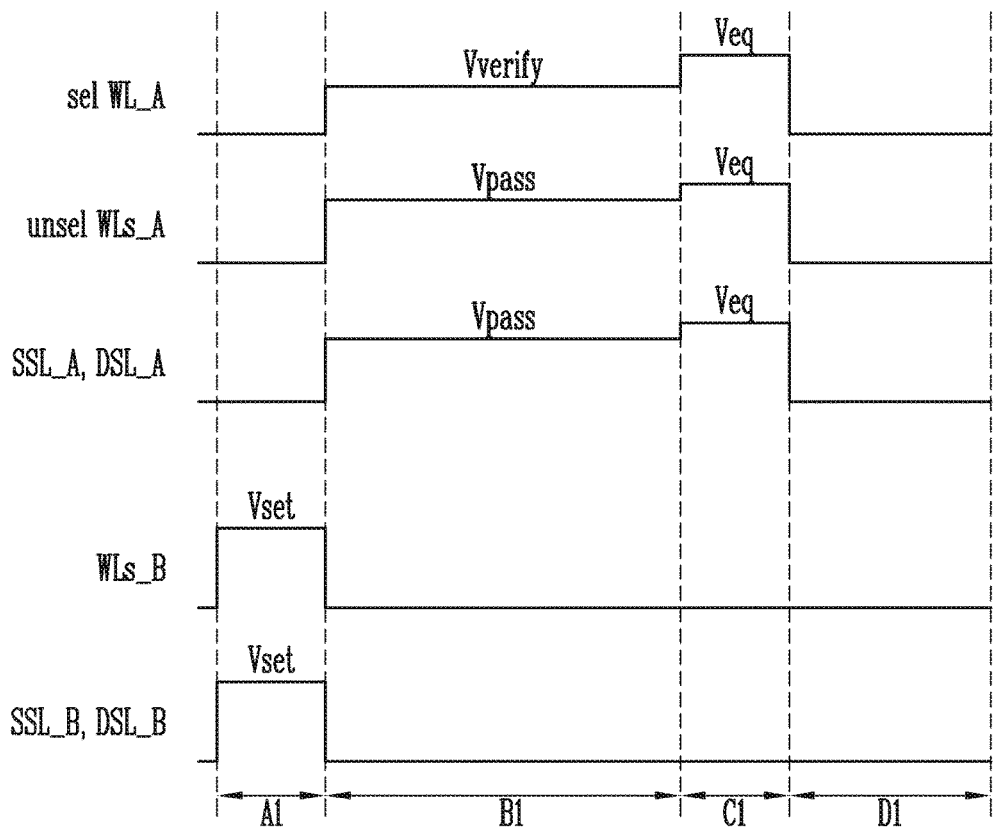

FIGS. 6A and 6B are a flowchart and a signal waveform diagram illustrating a first embodiment of the program verify operation (step S530) of FIG. 5.

While describing in detail the program verify operation according to the first embodiment of the present disclosure references will be made to FIGS. 1 to 5, 6A, and 6B.

The voltage generating circuit 131 may generate a positive set voltage Vset to be applied to the second memory block BLk2 that is a share memory block of the unselected memory blocks, in response to the second voltage generation control signal VG_signals2 outputted form the control logic 150. The global word line switch circuit 132 switches and transmits the positive set voltage Vset to the second global word line group GWLs_B in response to the switching control signals SW_signals. During period A1, the second pass circuit PC2 applies the positive set voltage Vset to the word lines WLs_B, a drain select line DSL_B, and a source select line SSL_B of the second memory block BLK2 in response to the first block select signal BLKWL_A, at step S610. Memory cells MC0 to MCn, a drain select transistor DST, and a source select transistor SST of the second memory block BLK2 are turned on by the positive set voltage Vset, and holes in the channel of the second memory block BLK2 are removed through the common source line CSL.

The voltage generating circuit 131 generates a verify voltage Vverify and a pass voltage Vpass to be applied to the selected memory block in response to the first voltage generation control signal VG_signals1 outputted from the control logic 150. The global word line switch circuit 132 switches and transmits the verify voltage Vverify and the pass voltage Vpass to the first global word line group GWLs_A in response to the switching control signals SW_signals. During period B1, the first pass circuit PC1 applies the verify voltage Vverify to a selected word line sel WL_A of word lines of the first memory block BLK1, and applies the pass voltage Vpass to the other unselected word lines unsel WLs_A, in response to the first block select signal BLKWL_A, at step S620. Here, the pass voltage Vpass may be applied to a drain select line DSL_A and a source select line SSL_A of the first memory block BLK1.

After the verify voltage Vverify has been applied, the potential or current of the bit lines BL1 to BLm of the first memory block BLK1 is sensed to perform the program verify operation.

Thereafter, the voltage generating circuit 131 generates an equalizing voltage Veq to be applied to the selected memory block in response to the first voltage generation control signal VG_signals1 outputted from the control logic 150. The global word line switch circuit 132 switches and transmits the equalizing voltage Veq to the first global word line group GWLs_A. The first pass circuit PC1 applies the equalizing voltage Veq to the word lines WLs_A, the drain select line DSL_A, and the source select line SSL_A of the first memory block BLK1 during period C1, at step S630. All of the word lines WLs_A, the drain select line DSL_A, and the source select line SSL_A are turned on by the equalizing voltage Veq. As a result, charges remaining in the channel of the first memory block BLK1 may be completely removed.

Thereafter, during period D1, the word lines WLs_A, the drain select line DSL_A and the source select line SSL_A are discharged to low potential levels. All of the word lines WLs_A, the drain select line DSL_A, and the source select line SSL_A are discharged from the same potential level, which is the potential level of the equalizing voltage Veq. Therefore, all of the word lines WLs_A, the drain select line DSL_A, and the source select line SSL_A may be discharged to the same level during the same discharge time.

According to the result of the above-described program verify operation S530, it is determined whether the program operation has passed or failed, at step S540.

As a result of the program verify operation, if the program operation has failed, the program voltage is increased by a step voltage, at step S550, and then the program operation is re-performed from the above-described program voltage apply operation, at step S520. As a result of the program verify operation, if the program operation has passed, the program operation is finished.

The program verify operation S530 of FIG. 5 may be performed in various ways, as described in the following embodiments.

FIGS. 7A and 7B are a flowchart and a signal waveform diagram illustrating a program verify operation (step S530) of FIG. 5 according to a second embodiment of the present disclosure.

While describing in detail the program verify operation according to the second embodiment of the present disclosure, references will be made to FIGS. 1 to 5, 7A, and 7B.

The voltage generating circuit 131 may generate a verify voltage Vverify and a pass voltage Vpass to be applied to a selected memory block in response to the first voltage generation control signal VG_signals1 outputted from the control logic 150. The global word line switch circuit 132 switches and transmits the verify voltage Vverify and the pass voltage Vpass to the first global word line group GWLs_A in response to the switching control signals SW_signals. During period A2, the first pass circuit PC1 applies the verify voltage Vverify to a selected word line sel WL_A of the word lines of the first memory block BLK1, and applies the pass voltage Vpass to the other unselected word lines unsel WLs_A, in response to the first block select signal BLKWL_A, at step S710. Here, the pass voltage Vpass may be applied to the drain select line DSL_A and the source select line SSL_A of the first memory block BLK1.

After the verify voltage Vverify has been applied, the potential or current of the bit lines BL1 to BLm of the first memory block BLK1 is sensed to perform the program verify operation.

Thereafter, the voltage generating circuit 131 may generate an equalizing voltage Veq to be applied to the selected memory block in response to the first voltage generation control signal VG_signals1 outputted from the control logic 150. The global word line switch circuit 132 switches and transmits the equalizing voltage Veq to the first global word line group GWLs_A. During period B2, the first pass circuit PC1 applies the equalizing voltage Veq to the word lines WLs_A, the drain select line DSL_A, and the source select line SSL_A of the first memory block BLK1, at step S720. All of the word lines WLs_A, the drain select line DSL_A, and the source select line SSL_A are turned on by the equalizing voltage Veq. As a result, charges remaining in the channel of the first memory block BLK1 may be completely removed.

The voltage generating circuit 131 generates a positive set voltage Vset to be applied to the second memory block BLk2 that is a share memory block of the unselected memory blocks in response to the second voltage generation control signal VG_signals2 outputted form the control logic 150. The global word line switch circuit 132 switches and transmits the positive set voltage Vset to the second global word line group GWLs_B in response to the switching control signals SW_signals.

The second pass circuit PC2 applies the positive set voltage Vset to the word lines WLs_B, the drain select line DSL_B, and the source select line SSL_B of the second memory block BLK2 during period C2 in response to a first block select signal BLKWL_A, at step S730. The memory cells MC0 to MCn, the drain select transistor DST, and the source select transistor SST of the second memory block BLK2 are turned on by the positive set voltage Vset, and holes in the channel of the second memory block BLK2 are removed through the common source line CSL.

During period C2, the word lines WLs_A, the drain select line DSL_A, and the source select line SSL_A are discharged to low potential levels. All of the word lines WLs_A, the drain select line DSL_A, and the source select line SSL_A are discharged from the same potential level, which is the potential level of the equalizing voltage Veq. Therefore, all of the word lines WLs_A, the drain select line DSL_A, and the source select line SSL_A may be discharged to the same level during the same discharge time.

Figure 8A:
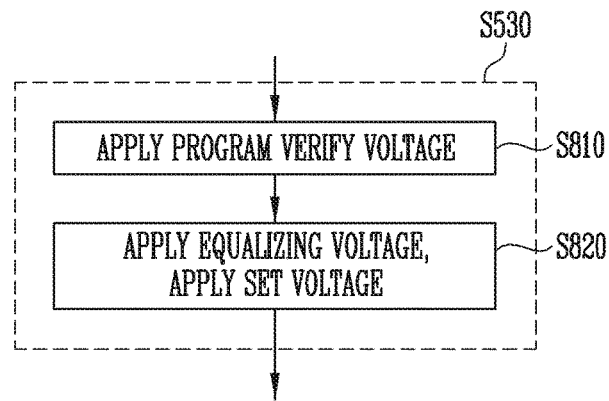
FIGS. 8A and 8B are a flowchart and a signal waveform diagram illustrating a program verify operation of the semiconductor memory device according to a third embodiment of the present disclosure.
Figure 8B:
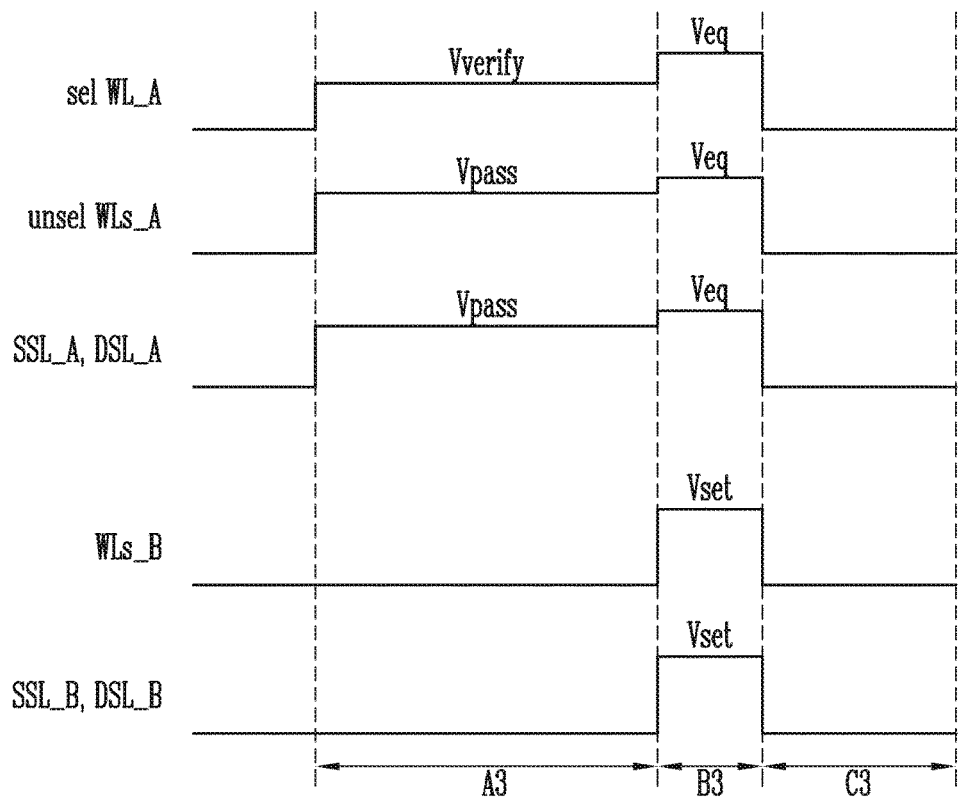

FIGS. 8A and 8B are a flowchart and a signal waveform diagram illustrating a program verify operation (step S530) of FIG. 5 according to a third embodiment of the present disclosure.

While describing in detail the program verify operation according to the third embodiment of the present disclosure, references will be made to FIGS. 1 to 5, 8A, and 8B.

The voltage generating circuit 131 may generate a verify voltage Vverify and a pass voltage Vpass to be applied to a selected memory block in response to the first voltage generation control signal VG_signals1 outputted from the control logic 150. The global word line switch circuit 132 switches and transmits the verify voltage Vverify and the pass voltage Vpass to the first global word line group GWLs_A in response to the switching control signals SW_signals. During period A3, the first pass circuit PC1 applies the verify voltage Vverify to a selected word line sel WL_A of the word lines of the first memory block BLK1, and applies the pass voltage Vpass to the other unselected word lines unsel WLs_A, in response to the first block select signal BLKWL_A, at step S810. Here, the pass voltage Vpass may be applied to the drain select line DSL_A and the source select line SSL_A of the first memory block BLK1.

After the verify voltage Vverify has been applied, the potential or current of the bit lines BL1 to BLm of the first memory block BLK1 is sensed to perform the program verify operation.

Thereafter, the voltage generating circuit 131 may generate an equalizing voltage Veq to be applied to the selected memory block in response to the first voltage generation control signal VG_signals1 outputted from the control logic 150. The global word line switch circuit 132 switches and transmits the equalizing voltage Veq to the first global word line group GWLs_A.

The voltage generating circuit 131 may generate a positive set voltage Vset to be applied to the second memory block BLk2 that is a share memory block of the unselected memory blocks in response to the second voltage generation control signal VG_signals2 outputted form the control logic 150. The global word line switch circuit 132 switches and transmits the positive set voltage Vset to the second global word line group GWLs_B in response to the switching control signals SW_signals.

The first pass circuit PC1 applies the equalizing voltage Veq to the word lines WLs_A, the drain select line DSL_A, and the source select line SSL_A of the first memory block BLK1 during period B3, and the second pass circuit PC2 applies the positive set voltage to the word lines the drain select line DSL_B, and the source select line SSL_B of the second memory block BLK2 during period B3 in response to the first block select signal BLKWL_A, at step S820.

All of the word lines WLs_A, the drain select line DSL_A, and the source select line SSL_A are turned on by the equalizing voltage Veq. As a result, charges remaining in the channel of the first memory block BLK1 may be completely removed. Memory cells MC0 to MCn, the drain select transistor DST, and the source select transistor SST of the second memory block BLK2 are turned on by the positive set voltage Vset, and holes in the channel of the second memory block BLK2 are removed through the common source line CSL.

Thereafter, during period C3, the word lines WLs_A, the drain select line DSL_A, and the source select line SSL_A are discharged to low potential levels. All of the word lines WLs_A, the drain select line DSL_A, and the source select line SSL_A are discharged from the same potential level, which is the potential level of the equalizing voltage Veq. Therefore, all of the word lines WLs_A, the drain select line DSL_A, and the source select line SSL_A may be discharged to the same level during the same discharge time.

In the third embodiment, because the positive set voltage Vset is applied to the share memory block (the second memory block) sharing with the selected memory block (the first memory block) during period B3 in which the equalizing voltage Veq is applied, the time it takes to perform the program verify operation time can be reduced, when compared to that of the first or second embodiment.

Figure 9A:
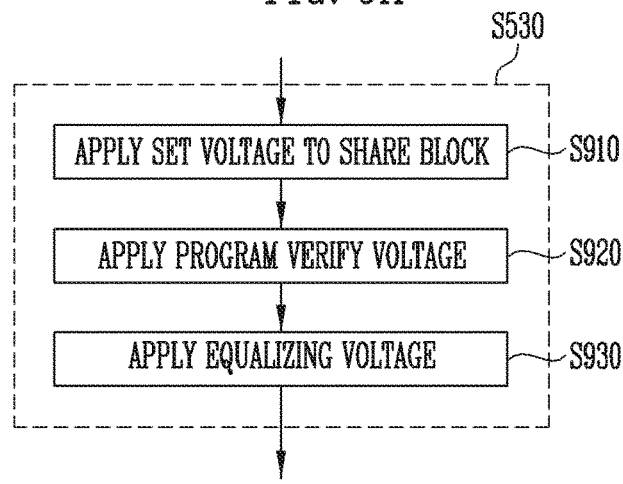
FIGS. 9A and 9B are a flowchart and a signal waveform diagram illustrating a program verify operation of the semiconductor memory device according to a fourth embodiment of the present disclosure.
Figure 9B:
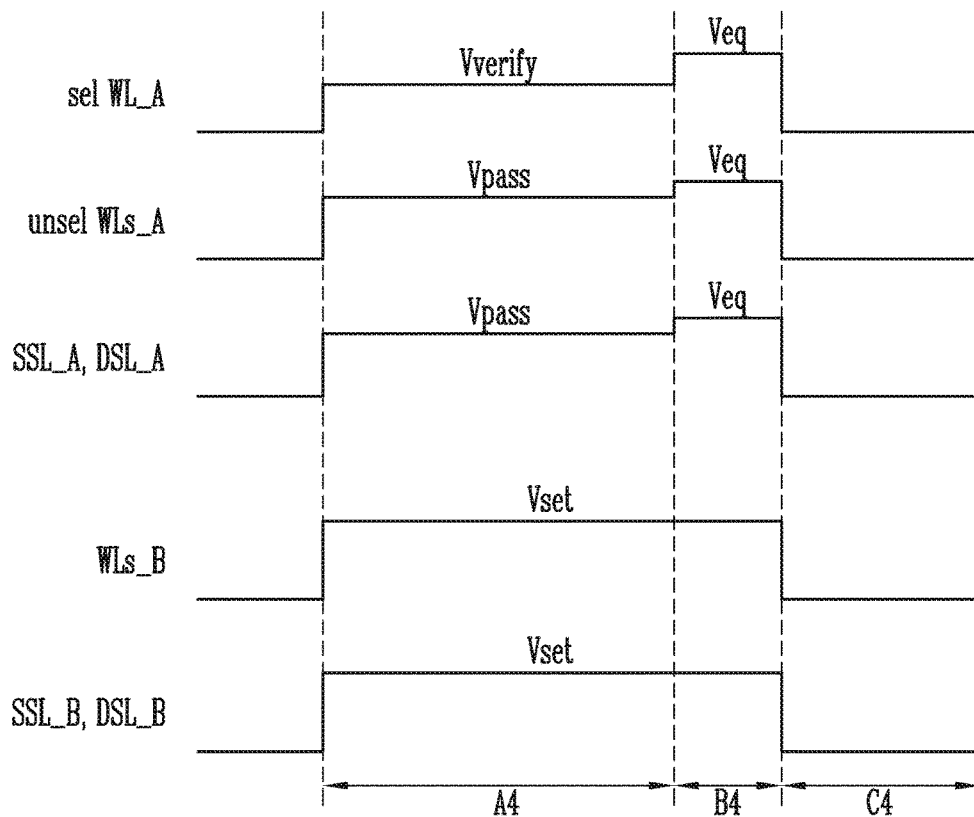

FIGS. 9A and 9B are a flowchart and a signal waveform diagram illustrating a program verify operation (step S530) of FIG. 5 according to a fourth embodiment of the present disclosure.

While describing in detail the program verify operation according to the fourth embodiment of the present disclosure, references will be made to FIGS. 1 to 5, 9A, and 9B.

The voltage generating circuit 131 may generate a positive set voltage Vset to be applied to the second memory block BLk2 that is a share memory block of the unselected memory blocks in response to the second voltage generation control signal VG_signals2 outputted form the control logic 150. The global word line switch circuit 132 switches and transmits the positive set voltage Vset to the second global word line group GWLs_B in response to the switching control signals SW_signals.

The voltage generating circuit 131 may generate a verify voltage Vverify and a pass voltage Vpass to be applied to a selected memory block in response to the first voltage generation control signal VG_signals1 outputted from the control logic 150. The global word line switch circuit 132 switches and transmits the verify voltage Vverify and the pass voltage Vpass to the first global word line group GWLs_A in response to the switching control signals SW_signals.

The second pass circuit PC2 applies the positive set voltage Vset to the word lines WLs_B, the drain select line DSL_B, and the source select line SSL_B of the second memory block BLK2 during periods A4 and B4 in response to the first block select signal BLKWL_A, at step S910.

During period A4, the first pass circuit PC1 applies the verify voltage Vverify to a selected word line sel WL_A of the word lines of the first memory block BLK1, and applies the pass voltage Vpass to the other unselected word lines unsel WLs_A, in response to the first block select signal BLKWL_A, at step S920. Here, the pass voltage Vpass may be applied to the drain select line DSL_A and the source select line SSL_A of the first memory block BLK1.

After the verify voltage Vverify has been applied, the potential or current of the bit lines BL1 to BLm of the first memory block BLK1 is sensed to perform the program verify operation.

Thereafter, the voltage generating circuit 131 may generate an equalizing voltage Veq to be applied to the selected memory block in response to the first voltage generation control signal VG_signals1 outputted from the control logic 150. The global word line switch circuit 132 switches and transmits the equalizing voltage Veq to the first global word line group GWLs_A.

The first pass circuit PC1 applies the equalizing voltage Veq to the word lines WLs_A, the drain select line DSL_A, and the source select line SSL_A of the first memory block BLK1 during period B4, at step S930.

All of the word lines WLs_A, the drain select line DSL_A, and the source select line SSL_A are turned on by the equalizing voltage Veq. As a result, charges remaining in the channel of the first memory block BLK1 may be completely removed. During periods A4 and B4, the memory cells MC0 to MCn, the drain select transistor DST, and the source select transistor SST of the second memory block BLK2 are turned on by the positive set voltage Vset applied to the second memory block BLK2, and holes in the channel of the second memory block BLK2 are removed through the common source line CSL.

Thereafter, during period C4, the word lines WLs_A, the drain select line DSL_A, and the source select line SSL_A are discharged to low potential levels. All of the word lines WLs_A, the drain select line DSL_A, and the source select line SSL_A are discharged from the same potential level, which is the potential level of the equalizing voltage Veq. Therefore, all of the word lines WLs_A, the drain select line DSL_A, and the source select line SSL_A may be discharged to the same level during the same discharge time.

In the fourth embodiment, because the positive set voltage Vset is applied to the share memory block (the second memory block) sharing with the selected memory block (the first memory block) during periods A4 and B4 in which the verify voltage Vverify and the equalizing voltage Veq are applied, the time it takes to perform the program verify operation can be reduced, when compared to that of the first or second embodiment.

Figure 10:
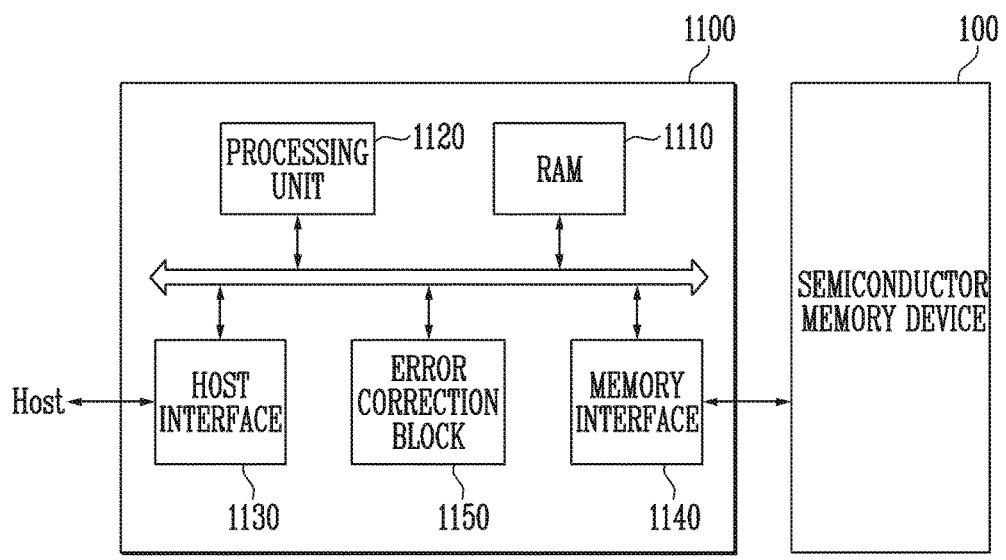
FIG. 10 is a block diagram illustrating a memory system including the semiconductor memory device of FIG. 1.

FIG. 10 is a block diagram illustrating a memory system 1000 including the semiconductor memory device 100 of FIG. 1.

Referring to FIG. 10, the memory system 1000 includes the semiconductor memory device 100 and a controller 1100.

The semiconductor memory device 100 may have the same configuration and operation as those of the semiconductor memory device described with reference to FIG. 1. Hereinafter, repetitive explanations will be omitted.

The controller 1100 may be coupled to a host Host and semiconductor memory device 100. The controller 1100 is configured to access the semiconductor memory device 100 in response to a request from the host Host. For example, the controller 1100 may control read, write, erase, and background operations of the semiconductor memory device 100. The controller 1100 may provide an interface between the host Host and the semiconductor memory device 100. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the overall operation of the controller 1100. In addition, the controller 1100 may temporarily store program data provided from the host Host during the write operation.

The host interface 1130 may include a protocol for performing data exchange between the host Host and the controller 1100. In an example of an embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or a NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an example of an embodiment, the error correction block 1150 may be provided as an element of the controller 1100.

The controller 1100 and the semiconductor memory device 100 may be integrated into a single semiconductor memory device. In an example of an embodiment, the controller 1100 and the semiconductor memory device 100 may be integrated into a single semiconductor memory device to form a memory card. For example, the controller 1100 and the semiconductor memory device 100 may be integrated into a single semiconductor memory device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor memory device to form a solid state drive (SSD). The SSD includes a storage device formed to store data in a semiconductor memory. When the memory system 1000 is used as the SSD, an operation speed of the host Host coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 11:
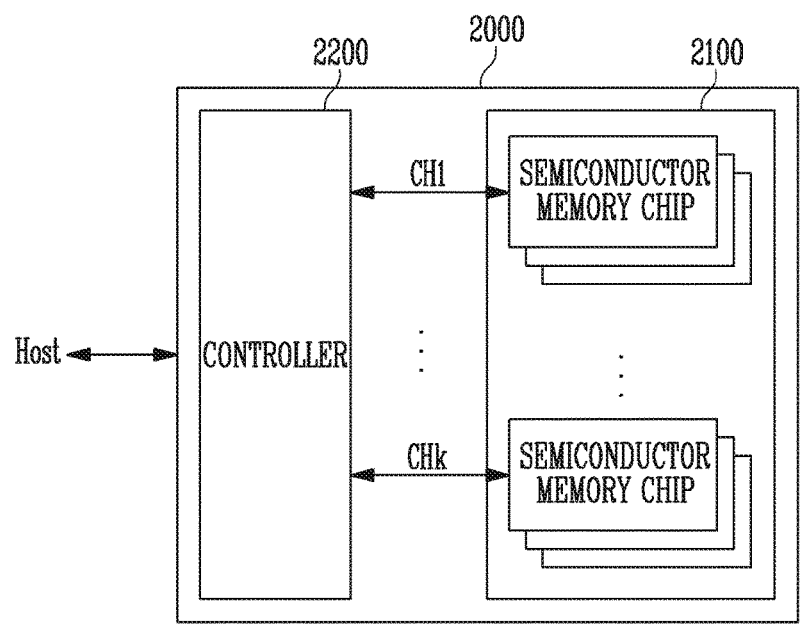
FIG. 11 is a block diagram illustrating an exemplary application of the memory system of FIG. 10.

FIG. 11 is a block diagram illustrating an example of application of the memory system of FIG. 10.

Referring to FIG. 11, the memory system 2000 includes a semiconductor memory device 2100 and a controller 2200. The semiconductor memory device 2100 includes a plurality of memory chips. The semiconductor memory chips are divided into a plurality of groups.

Referring to FIG. 11, it is illustrated that each of the plurality of groups communicates with the controller 2200 through first to k-th channels CH1 to CHk. Each semiconductor memory chip may have the same configuration and operation as those of an embodiment of the semiconductor memory device 100 described with reference to FIG. 1.

Each group communicates with the controller 2200 through one common channel. The controller 2200 has the same configuration as that of the controller 1100 described with reference to FIG. 10 and is configured to control a plurality of memory chips of the semiconductor memory device 2100 through the plurality of channels CH1 to CHk.

Figure 12:
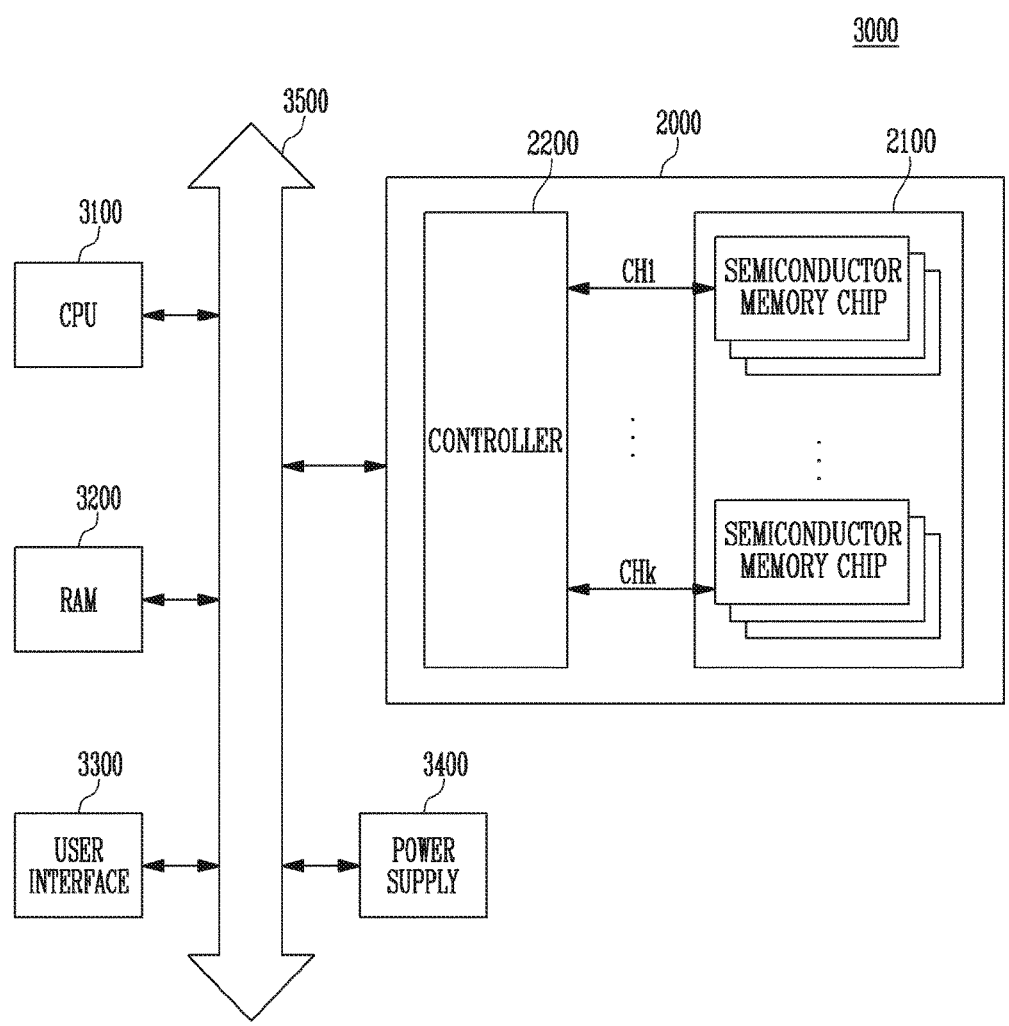
FIG. 12 is a block diagram illustrating an example of a computing system including the memory system illustrated with reference to FIG. 11.

FIG. 12 is a block diagram illustrating an example of a computing system 3000 including a memory system 2000 illustrated with reference to FIG. 11.

Referring to FIG. 12, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 12, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 12, the memory system 2000 described with reference to FIG. 11 may be provided. However, the memory system 2000 may be replaced with the memory system 1000 described with reference to FIG. 10. In an embodiment, the computing system 3000 may include all of the memory systems 1000 and 2000 described with reference to FIGS. 10 and 11.

According to the present disclosure, during a program verify operation of the semiconductor memory device, a set voltage is applied to a share memory block sharing with a selected memory block so that holes remaining in a channel of the share memory block are effectively removed, whereby electrical characteristics of the semiconductor memory device may be improved.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
a memory unit including a plurality of memory blocks;
a voltage supply circuit configured to generate a plurality of operating voltages and output the generated operating voltages to at least two global line groups during a program operation on the memory unit;
a pass circuit configured to couple word lines of the memory blocks to the at least two global line groups; and
a control logic configured to control the voltage supply circuit and the pass circuit such that during a program verify operation of the program operation, a program verify voltage is applied to a selected memory block of the memory blocks, and a set voltage is applied to a share memory block sharing a block decoder with the selected memory block among unselected memory blocks.

2. The semiconductor memory device according to claim 1, further comprising:
a plurality of block decoders configured to respectively generate a plurality of block select signals.

3. The semiconductor memory device according to claim 2, wherein the share memory block is a memory block that shares one of the block decoders with the selected memory block.

4. The semiconductor memory device according to claim 1, wherein during the program verify operation, the voltage supply circuit outputs the program verify voltage and a pass voltage to a first global line group of the at least two global line groups, and outputs the set voltage to a second global line group of the at least two global line groups.

5. The semiconductor memory device according to claim 4, wherein the pass circuit couples the first global line group to word lines of the selected memory block, and couples the second global line group to word lines of the share memory block.

6. The semiconductor memory device according to claim 1, wherein the control logic controls the voltage supply circuit and the pass circuit such that the set voltage is applied to the share memory block before the program verify voltage is applied to the selected memory block.

7. The semiconductor memory device according to claim 1, wherein the control logic controls the voltage supply circuit and the pass circuit such that the program verify voltage and an equalizing voltage successively are applied to the selected memory block during the program verify operation.

8. The semiconductor memory device according to claim 7, wherein the control logic controls the voltage supply circuit and the pass circuit such that the set voltage is applied to the share memory block after a period in which the equalizing voltage is applied to the selected memory block is finished.

9. The semiconductor memory device according to claim 7, wherein the control logic controls the voltage supply circuit and the pass circuit such that the set voltage is applied to the share memory block in a period in which the equalizing voltage is applied to the selected memory block.

10. The semiconductor memory device according to claim 7, wherein the control logic controls the voltage supply circuit and the pass circuit such that the set voltage is applied to the share memory block in a period in which the program verify voltage and the equalizing voltage are applied to the selected memory block.

11. A semiconductor memory device comprising:
a memory unit including a plurality of memory blocks;
a block decoder circuit configured to generate a plurality of block select signals in response to a decoder control signal and an address signal;

a pass circuit configured to couple first and second global word line groups to word lines of the memory blocks in response to the block select signals;

a voltage supply circuit configured to generate operating voltages and a set voltage and output the operating voltages and the set voltage to the first and second global word line groups; and a control logic configured to control the voltage supply circuit and the block decoder circuit such that during a program verify operation, the operating voltages are applied to word lines of a selected memory block of the memory blocks and the set voltage is applied to word lines of a share memory block sharing the block decoder circuit with the selected memory block among unselected memory blocks.

12. The semiconductor memory device according to claim 11, wherein the block decoder circuit comprises a plurality of block decoders configured to respectively generate the plurality of block select signals.

13. The semiconductor memory device according to claim 12, wherein the share memory block is a memory block that shares one of the block decoders with the selected memory block.

14. The semiconductor memory device according to claim 11, wherein the control logic controls the voltage supply circuit and the pass circuit such that the set voltage is applied to the share memory block before the operating voltages are applied to the selected memory block.

15. The semiconductor memory device according to claim 11, wherein the control logic controls the voltage supply circuit and the pass circuit such that a verify voltage and an equalizing voltage successively are applied to the selected memory block during the program verify operation.

16. The semiconductor memory device according to claim 15, wherein the control logic controls the voltage supply circuit and the pass circuit such that the set voltage is applied to the share memory block after a period in which the equalizing voltage is applied to the selected memory block is finished.

17. The semiconductor memory device according to claim 15, wherein the control logic controls the voltage supply circuit and the pass circuit such that the set voltage is applied to the share memory block in a period in which the equalizing voltage is applied to the selected memory block.

18. The semiconductor memory device according to claim 15, wherein the control logic controls the voltage supply circuit and the pass circuit such that the set voltage is applied to the share memory block in a period in which the verify voltage and the equalizing voltage are applied to the selected memory block.

19. A method of operating a semiconductor memory device, comprising:

providing a memory unit comprising at least two memory blocks sharing a single block decoder with each other;

applying a program voltage to a selected memory block included in the memory unit;

performing a program verify operation on the selected memory block; and applying, during the program verify operation, a set voltage to a share memory block sharing a block decoder circuit with the selected memory block.

20. The method according to claim 19, wherein the share memory block shares the single block decoder with the selected memory block.

21. The method according to claim 19, wherein the performing of the program verify operation comprises successively applying a verify voltage and an equalizing voltage to the selected memory block.

22. The method according to claim 21, wherein the applying of the set voltage to the share memory block comprises applying the set voltage to the share memory block before the verify voltage is applied to the selected memory block.

23. The method according to claim 21, wherein the applying of the set voltage to the share memory block comprises applying the set voltage to the share memory block after a period in which the equalizing voltage is applied to the selected memory block is finished.

24. The method according to claim 21, wherein the applying of the set voltage to the share memory block comprises applying the set voltage to the share memory block in a period in which the equalizing voltage is applied to the selected memory block.

25. The method according to claim 21, wherein the applying of the set voltage to the share memory block comprises applying the set voltage to the share memory block in a period in which the verify voltage and the equalizing voltage are applied to the selected memory block.

* * * * *